United States Patent
Ito

(10) Patent No.: US 6,646,484 B2
(45) Date of Patent: Nov. 11, 2003

(54) PLL CIRCUIT INCLUDING A CONTROL LOGIC CIRCUIT FOR ADJUSTING THE DELAY TIMES OF THE CLOCKS SO THAT THE PHASE ERROR OF THE CLOCKS IS REDUCED

(75) Inventor: Yoshiaki Ito, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/141,143

(22) Filed: May 9, 2002

(65) Prior Publication Data

US 2003/0117190 A1 Jun. 26, 2003

(30) Foreign Application Priority Data

Dec. 21, 2001 (JP) .......................................... 2001-389566

(51) Int. Cl.[7] ................................................ H03L 7/06
(52) U.S. Cl. ........................ 327/158; 327/163; 327/161; 327/236
(58) Field of Search .................................. 327/156, 158, 327/159, 161, 162, 163, 233, 236, 237, 244, 261, 276, 277, 284, 2, 3, 7, 12, 147, 149, 153, 155; 331/1 A, 25, DIG. 2, 18, 1 R; 375/354, 375, 376

(56) References Cited

U.S. PATENT DOCUMENTS

| | | | | |
|---|---|---|---|---|
| 5,118,975 A | * | 6/1992 | Hillis et al. .................. 327/158 |
| 5,223,755 A | * | 6/1993 | Richley ....................... 327/158 |
| 5,663,665 A | * | 9/1997 | Wang et al. .................... 327/3 |
| 5,712,884 A | * | 1/1998 | Jeong ........................... 375/375 |
| 5,764,711 A | * | 6/1998 | Jokura ......................... 375/376 |
| 5,771,264 A | * | 6/1998 | Lane ........................... 375/376 |
| 5,790,612 A | * | 8/1998 | Chengson et al. ........... 375/373 |
| 5,801,559 A | * | 9/1998 | Sawai et al. ................. 327/116 |
| 5,946,244 A | * | 8/1999 | Manning ..................... 327/194 |
| 5,963,069 A | * | 10/1999 | Jefferson et al. ............ 327/158 |
| 6,072,347 A | * | 6/2000 | Sim ............................. 327/276 |
| 6,087,868 A | * | 7/2000 | Millar ......................... 327/156 |
| 6,373,913 B1 | * | 4/2002 | Lee ............................. 375/376 |
| 6,404,248 B1 | * | 6/2002 | Yoneda ....................... 327/158 |

FOREIGN PATENT DOCUMENTS

JP     2001-111415     4/2001

\* cited by examiner

*Primary Examiner*—Timothy P. Callahan
*Assistant Examiner*—Hai L. Nguyen
(74) *Attorney, Agent, or Firm*—Oblon, Spivak, McClelland, Maier & Neustadt, P.C.

(57) ABSTRACT

VDLs and delay an input clock and a return clock and provide a delayed input clock and a delayed return clock to a PLL part. The PLL part receives the delayed input clock and the delayed return clock, and outputs a PLL output so that these signals are synchronous with each other. This PLL output finally returns as a return clock via an external circuit. A PD detects a phase difference between the input clock and the return clock, and outputs a phase comparison signal. A control logic circuit determines a degree of phase advance of the return clock with respect to the input clock based on the phase comparison signal, and controls a delay time of the VDL so that a phase error between the input clock and the return clock is zero.

13 Claims, 11 Drawing Sheets

US 6,646,484 B2

PLL CIRCUIT INCLUDING A CONTROL LOGIC CIRCUIT FOR ADJUSTING THE DELAY TIMES OF THE CLOCKS SO THAT THE PHASE ERROR OF THE CLOCKS IS REDUCED

BACKGROUND OF THE INVENTION

1. Field of the Invention

The present invention relates to a PLL circuit which raises less phase error (offset) in a semiconductor integrated circuit.

2. Description of the Background Art

The higher the speed due to miniaturization of LSI technique, the smaller the allowance for the phase error between system clock and inside the LSI, which improves the frequency of using a PLL circuit for compensating such phase error.

FIG. 14 is a block diagram showing a configuration of a conventional PLL circuit. As shown in FIG. 14, a PLL circuit 20 is configured by a PFD (Phase Frequency Detector; phase comparator) 21, a CP (Charge Pump) 22, an LF (Loop Filter) 23 and a VCO (Voltage Controlled Oscillator) 24. With this configuration, the PLL circuit 20 receives an input clock ICLK which is a reference clock and a return clock RCLK, conducts a phase synchronization process (PLL process) so as to make the input clock ICLK and the return clock RCLK synchronous with each other, and outputs a PLL output OUTP.

The PFD 21 detects a phase difference (time) between the input ICLK and the return clock RCLK and outputs a phase comparison signal to the CP 22. The CP 22 converts the phase comparison signal to a current value and outputs it to the LF 23. The LF 23 converts the current value obtained from the CP 22 to a voltage value. The VCO 24 outputs a PLL output OUTP which oscillates at a frequency based on the voltage value obtained in the LF 23. This PLL output OUTP returns to the PFD 21 as the return clock RCLK via an external circuit.

FIG. 15 is a timing chart showing a relationship between input clock ICLK and return clock RCLK after synchronization by the PLL circuit. As shown in FIG. 15, the input clock ICLK and the return clock RCLK are completely synchronous with each other with an offset OS being "0".

In the PLL circuit 20, however, asymmetry in the circuit configuration of the respective circuits which generate the input clock ICLK and the return clock RCLK, or unevenness generated in the manufacture process of the semiconductor circuit may cause a phase error between the PFD 21 and the CP 22. Though the former can be improved by eliminating the phase error by improving the asymmetry, it is difficult to improve the latter because it is just like a physical phenomenon.

Therefore, it is difficult to make the phase error completely zero in a PLL circuit of such a conventional configuration, and a small phase error necessarily arises. Though the absolute value of the time of such a phase error has not changed in the past, the allowable range of phase error decreases because the ratio with respect to the clock periodicity which is becoming faster year after year certainly increases, which is getting unignorable situation.

FIG. 16 is a timing chart showing a relationship between input clock ICLK and return clock RCLK after synchronization by the PLL circuit. As shown in FIG. 16, an offset not being "0" occurs between the input clock ICLK and the return clock RCLK.

Though the conventional PLL circuit desires perfect synchronization as shown in FIG. 15, there has been a practical problem that an unignorable offset OS not being "0" occurs, as shown in FIG. 16.

SUMMARY OF THE INVENTION

It is an object of the present invention to provide a PLL circuit in which a phase error is reduced to an ignorable level.

According to the present invention, a PLL circuit includes first and second delay means, a PLL part, and phase difference reducing delay control means. The first delay means delays a reference clock by a first delay time to obtain a delayed reference clock, the second delay means delays a return clock by a second delay time to obtain a delayed return clock, the PLL part receives the delayed reference clock and the delayed return clock and outputs a PLL output so that phases of these clocks are synchronous with each other, a signal in association with the PLL output returns thereto as the return clock, the phase difference reducing delay control means performs a delay means controlling process based on the reference clock and the return clock, and the delay means control process changes at least one of the first and second delay times so that a phase difference between the reference clock and the return clock is reduced.

The phase difference reducing delay control means of the PLL circuit of the present invention can improve a phase error between the input clock and the return clock even when a phase difference occurs between the input clock and the return clock during phase synchronization by the PLL part by executing a delay means controlling process which changes at least one of the first and the second delay times so that the phase difference between the reference clock and the return clock is reduced based on the basis of the reference clock and the return clock.

According to the present invention, the PLL circuit is characterized in that the phase difference reducing delay controlling means includes phase comparing means and delay control means, the phase comparing means compares phases of the reference clock and the return clock to output a phase comparison signal, and the delay controlling means performs the delay means controlling process wherein a degree of advance in phase of the return clock with respect to the input clock is determined based on the phase comparison signal, and first and a second delay control signals are outputted to the first and second delay means, the first and the second delay control signals being such that the instruction contents thereof change in such a direction that a relative delay time of the second delay time to the first delay time increases when a phase advance determination representing that the return clock advances in phase is made, and in such a direction that the relative delay time decreases when a phase delay determination representing that the return clock delays in phase is made.

The delay control means of the PLL circuit can change the above-mentioned relative time in the direction of reducing the phase difference between the delayed input clock and the return clock by outputting the first and the second delay control signals the first and the second delay control signals of which instruction contents change in such a direction that a relative delay time of the second delay time to the first delay time increases when a phase advance determination representing that the return clock advances in phase is made, and in such a direction that the relative delay time decreases when a phase delay determination representing that the return clock delays in phase is made.

According to the present invention, the PLL circuit is characterized in that the phase difference reducing delay control means starts the delay means controlling process after a predetermined time which is not less than a time within which the PLL part is assumed to complete synchronization process of the delayed reference clock and the delayed return clock has elapsed.

The phase difference reducing delay control means of the PLL circuit can improve the phase error without adversely affecting the synchronization process by the PLL part by starting the delay means control process after the synchronization process by the PLL part has completed.

According to the present invention, the PLL circuit further includes a synchronization detecting circuit receives the delayed reference clock and the delayed return clock, detects whether or not these signals have come into synchronization with each other to output a synchronization detection signal, and the phase difference reducing delay control means starts the delay means controlling process after the synchronization detection signal has indicated synchronization of the delayed reference clock and the delayed return clock.

The phase difference reducing delay control means of the PLL circuit can improve the above-mentioned phase error rapidly after completion of synchronization without adversely affecting the synchronization process by the PLL part by starting the delay means control process after the synchronization detecting signal indicates synchronization of the delayed reference clock and the delayed return clock.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
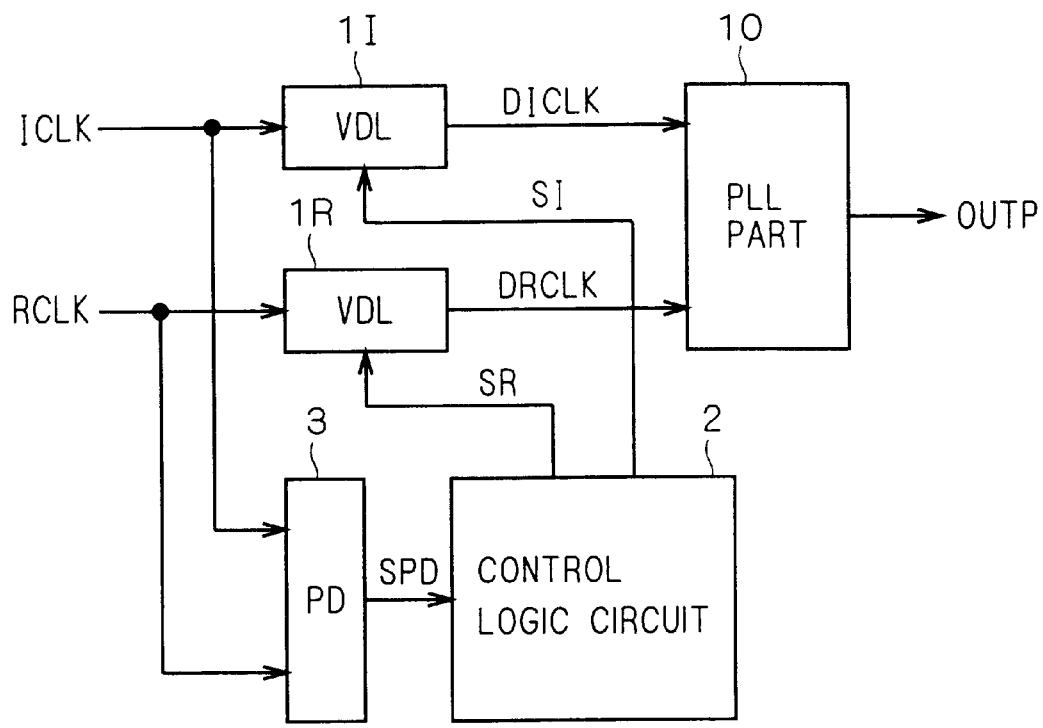
FIG. 1 is a block diagram showing a configuration of a PLL circuit which is the first preferred embodiment of the present invention.
Figure 14:
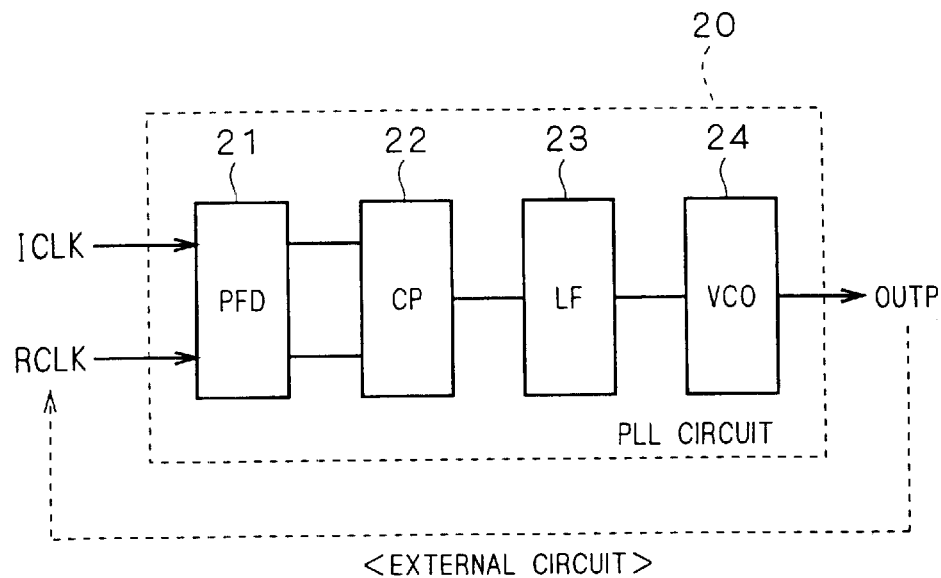
FIG. 14 is a block diagram showing a configuration of a conventional PLL circuit.
Figure 15:
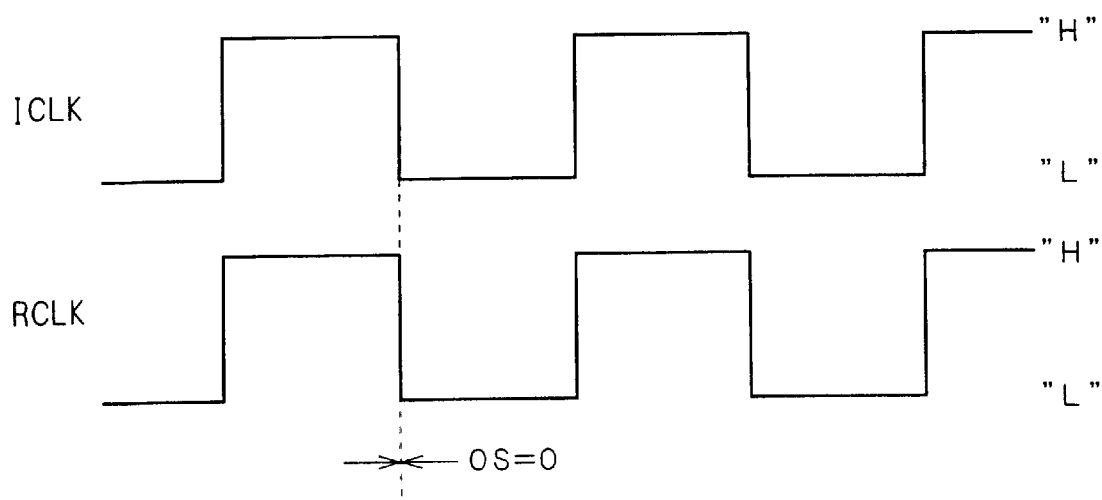
FIG. 15 is a timing chart showing a relationship between input clock and return clock after synchronization by the PLL circuit.
Figure 16:
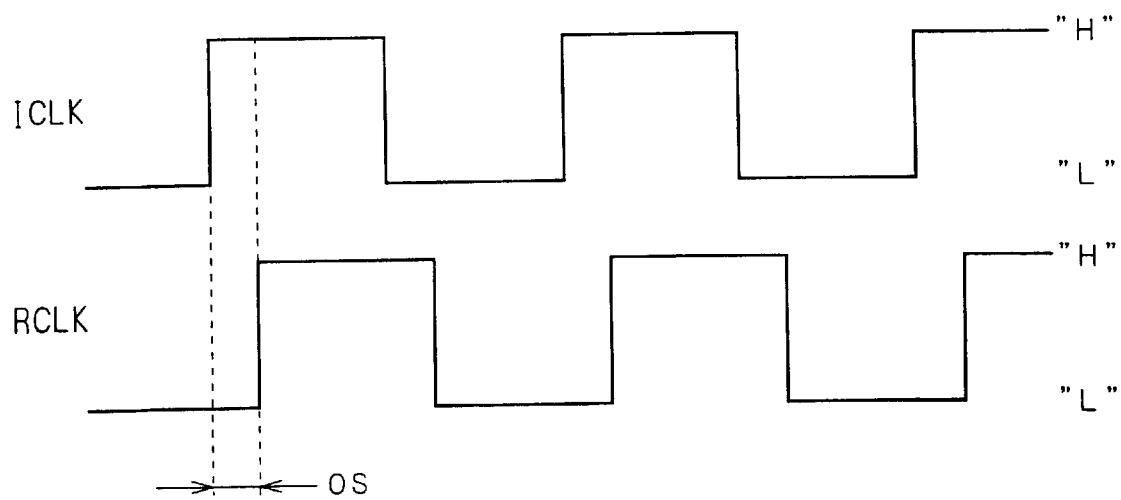
FIG. 16 is a timing chart showing a relationship between input clock and return clock after synchronization by the PLL circuit.

FIG. 1 is a block diagram showing a configuration of a PLL circuit which is the first preferred embodiment of the present invention. As shown in FIG. 1, the PLL circuit according to the first preferred embodiment 1has a VDL (Variable Delay Line (circuit)) 1I, a VDL 1R, a control logic circuit 2 and a PD 3 in addition to a PLL part 10 which corresponds to the PLL circuit (PLL circuit 20 or the like in FIG. 14) of the conventional configuration.

The VDL 1I receives an input clock ICLK, delays the input clock ICLK by a delay time based on a control signal SI and supplies a delayed input clock DICLK to the PLL part 10. The VDL 1R receives a return clock RCLK, delays the return clock RCLK by a delay time based on a delay control signal SR and outputs a delayed return clock DRCLK to the PLL part 10.

The PLL part 10 receives the delayed input clock DICLK and the delayed return clock DRCLK, conducts a PLL operation so that these signals are synchronous with each other, and outputs a PLL output OUTP. Though omitted in FIG. 1, this PLL output OUTP will finally return as a return clock RCLK via an external circuit.

On the other hand, the PD 3 receives the input clock ICLK and the return clock RCLK, detects a phase difference between these clocks and outputs a phase comparison signal SPD to the control logic circuit 2. The control logic circuit 2 determines a degree of advance of the delayed return clock DRCLK with respect to the delayed input clock DICLK on the basis of the phase comparison signal SPD, and generates a control signal SI and a delay control signal SR based on the result of the determination.

Figure 2:
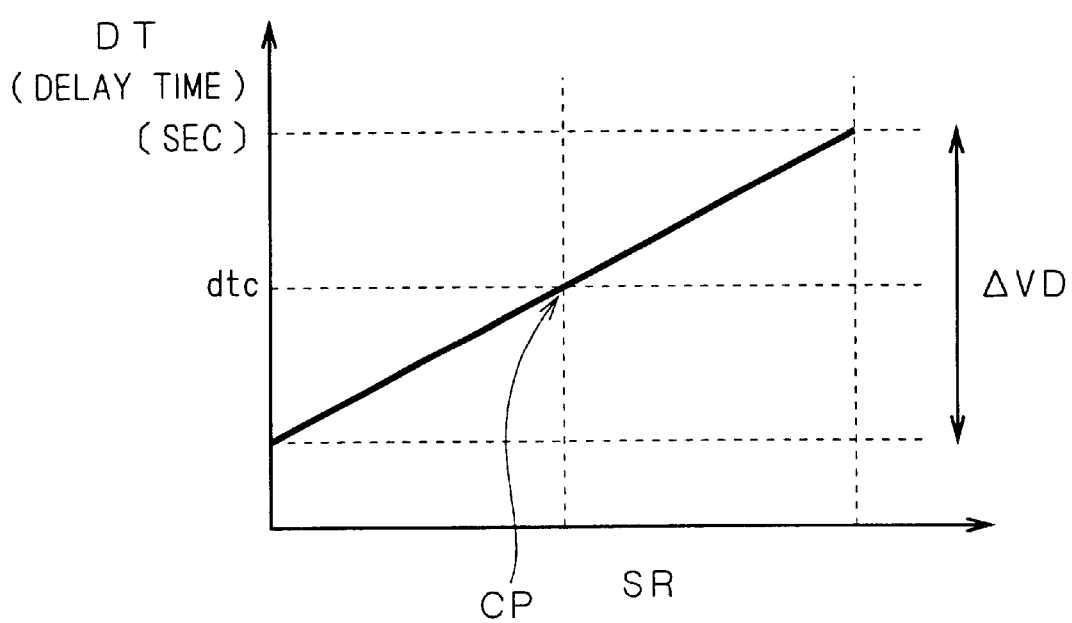
FIG. 2 is a graph showing a relationship between control signal and delay time in a VDL of FIG. 1.

FIG. 2 is a graph showing a relationship between delay control signal SR and delay time DT in the VDL 1R. As shown in FIG. 2, the delay time DT varies within a variable delay range □VD in proportion to the value of the delay control signal SR (there is a case of a bit number providing "1"). The delay time DT corresponding to a center point of delay range CP is defined as a delay center time DCT. On the other hand, the VDL 1I is fixed in the vicinity of the delay center time dct by the control signal SI.

Figure 3:
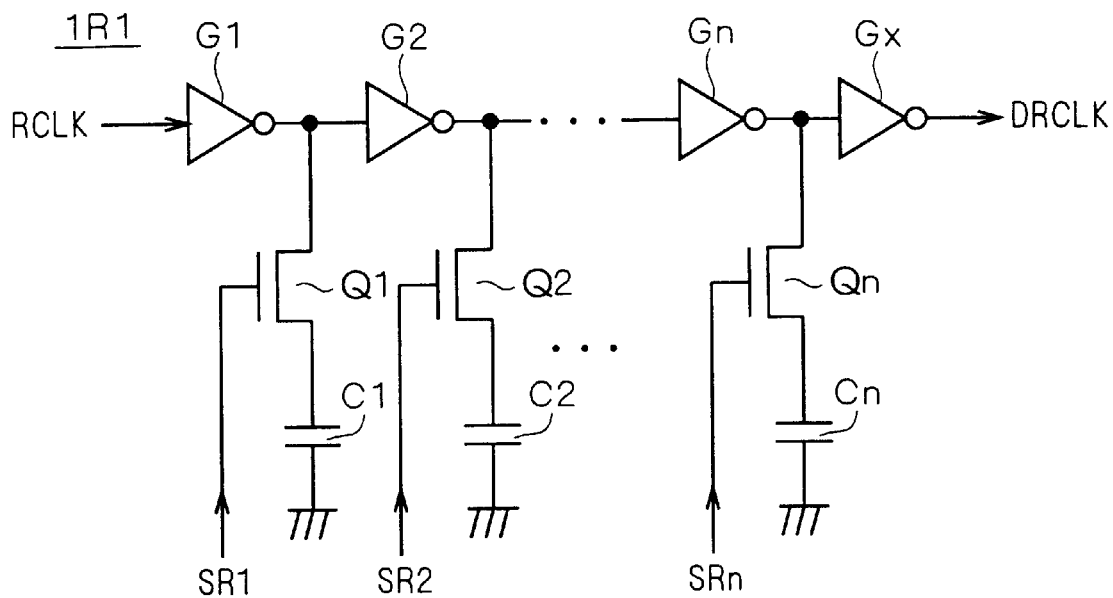
FIG. 3 is a circuit diagram showing an example of an internal configuration of the VDL of FIG. 1.

FIG. 3 is a circuit diagram showing an example of an internal configuration of the VDL 1R. As shown in FIG. 3, in a VDL 1R1, inverters of (n+1) stages comprising inverters G1 to Gn of n stages and a waveform shaping inverter Gx are serially connected. The inverter G1 receives the return clock RCLK at its input portion, and an output of the waveform shaping inverter Gx embodies the delayed return clock DRCLK.

Output portions of the inverters G1 to Gn are respectively connected to drains of transistor switches Q1 to Qn, and sources of the transistor switches Q1 to Qn are grounded via capacitors C1 to Cn, respectively.

Gates of the transistor switches Q1 to Qn respectively receive delay digital signals SR1 to SRn for delay control.

Any of the capacitors C1 to Cn have the capacity value C0. The delay digital signals SR1 to SRn embody the delay control signal SR.

In such a configuration, since a transistor switch Qi which receives at its gate a delay digital signal Sri (i=1 to n) providing "1" ("H") is turned ON, capacity values of the capacitors associated with the inverters G1 to Gn increase in correspondence with that a capacitor Ci is electrically connected to an output portion of an inverter Gi, so that the delay time DT increases corresponding to the time for charging and discharging the capacitors. That is, as shown in FIG. 2, the VDL 1R1 functions as capacity value changing means wherein the delay time DT changes in proportion to the number of signals providing "1" among the delay digital signals SR1 to SRn which embody the control signal SR. Though the signal waveform is deteriorated more or less due to the charging and discharging operation with respect to the capacitor Ci electrically connected to the output portion of the inverter Gi, it will be bettered by the waveform shaping by a reverse amplification operation of the next-stage inverter G(i+1) or Gx.

Figure 4:
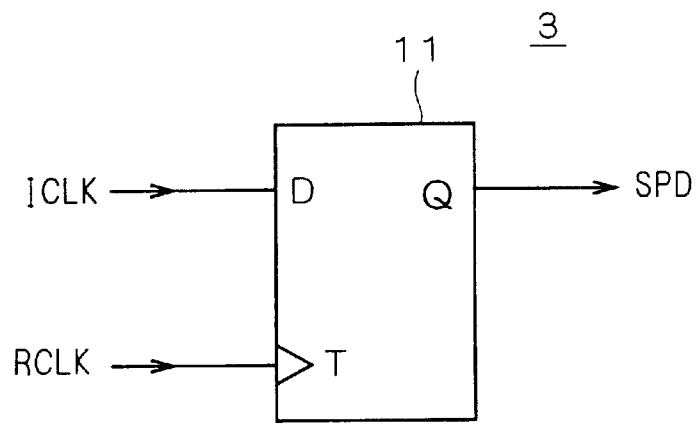
FIG. 4 is an explanatory view showing an example of an internal configuration of a PD of FIG. 1.

FIG. 4 is an explanatory view showing an example of an internal configuration of the PD 3. As shown in FIG. 4, the PD 3 is configured by a single D-FF (D-type flip-flop) 11. The D-FF 11 receives the input clock ICLK as input data D, receives the return clock RCLK as a toggle input, and outputs the phase comparison signal SPD from a Q output.

The D-FF 11 uses a rising edge of the toggle input as a trigger, and when the input clock ICLK advances in phase than the return clock RCLK, the phase comparison signal SPD is "H", whereas when the return clock RCLK advances in phase than the input clock ICLK, the phase comparison signal SPD is "L". Hereinafter, it is to be understood that the D-FF described in the present preferred embodiment uses a rising edge of toggle input as a trigger.

Figure 5:
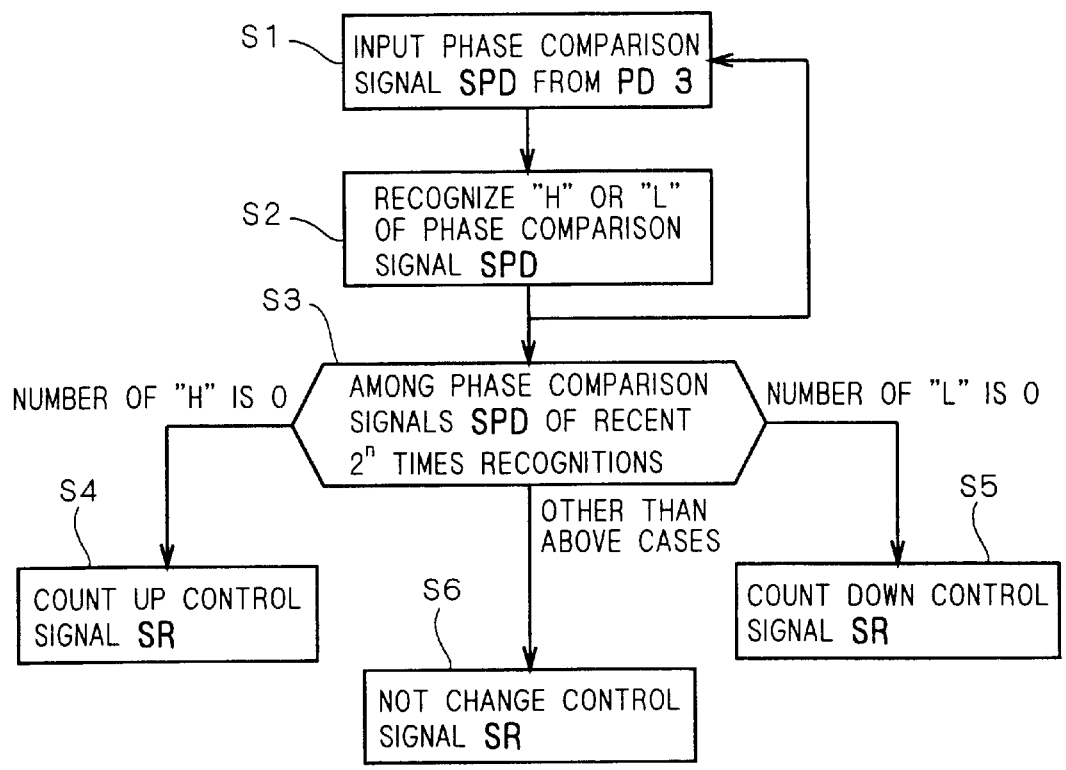
FIG. 5 is a flowchart showing an operation of a control logic circuit of FIG. 1.

FIG. 5 is a flowchart showing an operation of the control logic circuit 2. In the following, a counting operation of the delay control signal SR by the control logic circuit 2 (operation of increasing/decreasing the number of signals providing "1" among the delay digital signals SR1 to SRn) will be explained with reference to FIG. 5.

First, the phase comparison signal SPD is inputted from the PD 3 in step S1, and the "H" or "L" of the phase comparison signal SPD is recognized in step S2. Then steps S1 and S2 are repeated.

In parallel with the above repetitive operation, in step S3, if the number of "H" is zero (all "L") in the recognition results of phase comparison signal SP of recent $2^n$-time recognitions, a phase advance determination indicating that the return clock RCLK advances in phase than the input clock ICLK is made, and the flow proceeds to step S4.

To the contrary, in step S3, if the number of "L" is zero (all "H"), a phase delay determination indicating that the return clock RCLK delays in phase than the input clock ICLK is made, and the flow proceeds to step S5.

Furthermore, in step S3, if both of the numbers of "L" and "H" are not zero (each of "H" and "L" is recognized at least once), it is determined that there is no phase difference between the return clock RCLK and the input clock ICLK, and the flow proceeds to step S6.

In step S4 to be executed when the phase advance determination is made in step S3, a VDL control process is executed such that the VDL 1R (1R1) is controlled so as to generate the delayed return clock DRCLK while delaying the return clock RCLK by a delay time DT which is longer than the current delay time by counting up the delay control signal SR (increasing the number of signals providing "1" among the delay digital signals SR1 to SRn).

As a result of this, the relative delay time of the delay time DT (second delay time) by the VDL 1R with respect to the delay time (first delay time) by the VDL 1I increases, so that the phase error between the input clock ICLK and the return clock RCLK is improved in correspondence with that the phase advance of the return clock RCLK is suppressed.

In step S5 to be executed when the phase delay determination is made in step S3, a VDL control process is executed such that the VDL 1R is controlled so as to generate the delayed return clock DRCLK while delaying the return clock RCLK by a delay time DT which is shorter than the current delay time by counting down the delay control signal SR (decreasing the number of signals providing "1" among the delay digital signals SR1 to SRn).

As a result of this, the relative delay time of the delay time DT by the VDL 1R with respect to the delay time by the VDL 1I decreases, so that the phase error between the input clock ICLK and the return clock RCLK is improved in correspondence with that the phase delay of the return clock RCLK is suppressed.

In step S6 to be executed when it is determined that there is no phase difference in step S3, a VDL control process is executed such that the VDL 1R is controlled so as to generate the delayed return clock DRCLK while delaying the return clock RCLK by the current delay time DT by keeping the delay control signal SR unchanged.

In this manner, the control logic circuit 2 controls the delay time DT of the VDL 1R so that the phase error between the input clock ICLK and the return clock RCLK is zero on the basis of the phase comparison signal DPD from the PD 3. As a result of this, it is possible to calibrate the phase error between the input clock ICLK and the return clock RCLK occurring in the PLL part 10 which is a PLL circuit of the conventional configuration, and hence it is possible to obtain a PLL circuit not causing a phase error.

Furthermore, the VDL 1R1 of the first preferred embodiment can changes the delay time DT correlated to the charging and discharging time for the capacity with accuracy by changing the capacity value associated with the inverters G1 to Gn and Gx which are delay lines based on the delay digital signals SR1 to SRn.

It is to be noted that the PLL part 10 requires a certain time until it achieves synchronization because it performs the PLL operation by the return loop. However, since the control logic circuit 2 changes the delay control signal SR after recognizing the phase comparison signal SPD $2^n$ times, by setting the n sufficiently large, an erroneous operation due to change of the control signal will not occur until synchronization is secured by the PLL part 10 because the PLL part 10 securely achieves synchronization until the delay control signal SR changes.

<Second Preferred Embodiment>

Figure 6:
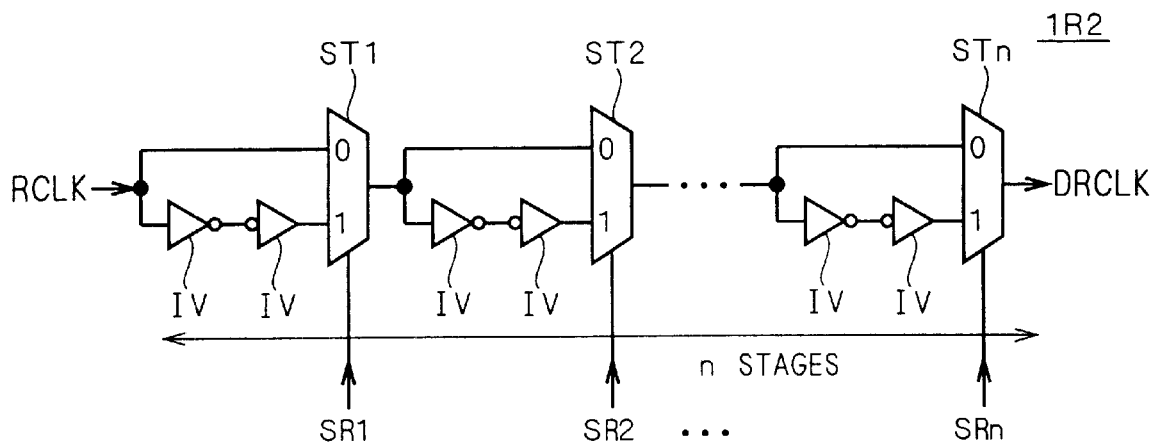
FIG. 6 is a circuit diagram showing a configuration of a VDL in a PLL circuit which is the second preferred embodiment of the present invention.

FIG. 6 is a circuit diagram showing a configuration of a VDL 1R in a PLL circuit which is the second preferred embodiment of the present invention.

As shown in FIG. 6, a VDL 1R2 is provided with n-stage selectors ST1 to STn arranged in serial. The respective "0" input portions of the selectors ST1 to STn are serially connected via only a signal line, and the "1" input portions are serially connected via an inverter IV of two-stage serial connection.

That is, the selector ST1 directly inputs a return clock RCLK to the "0" input portion, and inputs a return clock RCLK to the "1" input portion via the two-stage inverter IV. As for the selector ST2, the output of the selector ST1 is connected to the "0" input portion and the output of the selector ST1 is connected to the "1" input portion via the two-stage inverter IV. The same applies for achieving connections of the selectors ST2 to STn, and the delayed return clock DRCLK is outputted from the STn. Then, the selectors ST1 to STn respectively receive the delay digital signals SR1 to SRn at their control inputs.

The VDL 1R2 according to the second embodiment having the above-described configuration has a delay path changing function wherein a delay line is formed by the selectors ST1 to STn and the inverter IV, and the signal transmission path varies in accordance with the delay digital signals SR1 to SRn (combination of selected two invertors IV varies). Each inverter IV has the same signal transmission delay time.

Therefore, since the selector STi that receives the delay digital signal SRi (i=1 to n) providing "1" as the control input selects the "1" input portion, the delay time DT increases in correspondence with that the signal is transmitted via the two-stage inverter IV. That is, as shown in FIG. 2, the delay time DT of the VDL 1R2 varies in proportion to the number of signals providing "1" among the delay digital signals SR1 to SRn. Other configurations than that of the VDL 1R is as same as those described for the first preferred embodiment.

The VDL 1R2 of the second preferred embodiment is configured by selectors ST1 to STn and an n×2-stage invertor IV, and any of these can be formed by a transistor. Therefore, the VDL 1R2 provides an advantage that a circuit scale can be reduced since this can be configured only by transistor without requiring capacitor as is the case of the VDL 1R1 of the first preferred embodiment shown in FIG. 3. However, as for the accuracy of delay time DT, the first preferred embodiment is superior.

<Third Preferred Embodiment>

Figure 7:
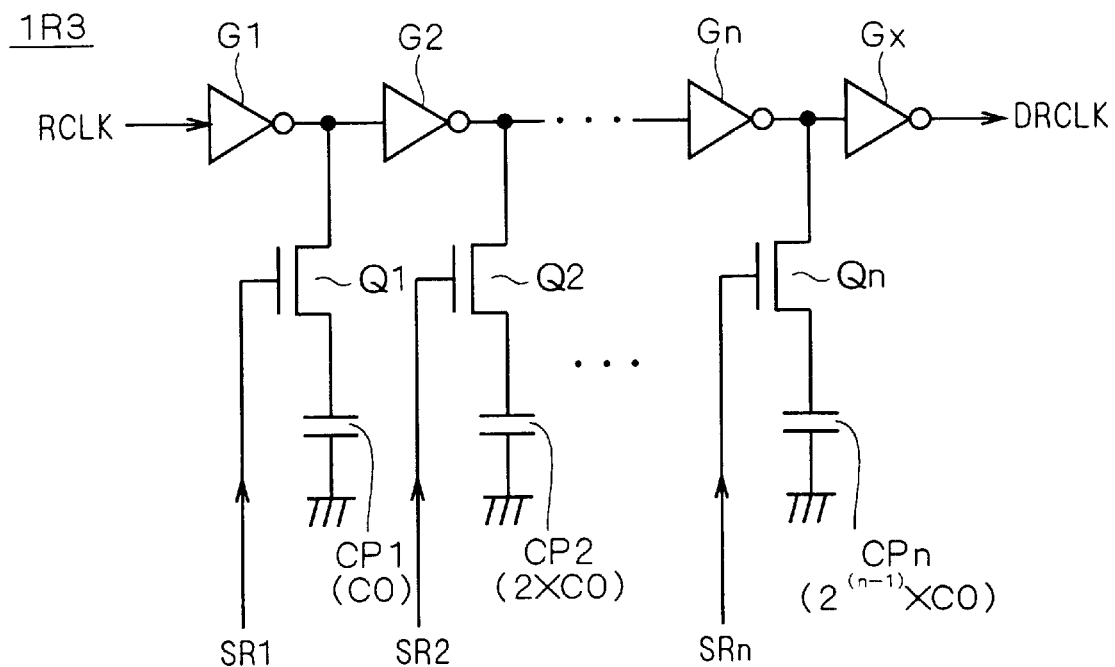
FIG. 7 is a circuit diagram showing a configuration of a VDL in a PLL circuit which is the third preferred embodiment of the present invention.

FIG. 7 is a circuit diagram showing a configuration of a VDL 1R in a PLL circuit which is the third preferred embodiment of the present invention.

As shown in FIG. 7, a VDL 1R3 is so configured that an (n+1) stage inverter composed of n-stage connected inverters G1 to Gn and a waveform shaping inverter Gx are serially connected. And, the inverter G1 receives the return clock RCLK at its input portion, and an output of the waveform shaping inverter Gx embodies the delayed return clock DRCLK.

Output portions of the inverters G1 to Gn are respectively connected to drains of transistor switches Q1 to Qn, and sources of the transistor switches Q1 to Qn are respectively grounded via capacitors CP1 to CPn.

Gates of the transistor switches Q1 to Qn respectively receive the delay digital signals SR1 to SRn which embody the delay control signal SR. The capacitors CP1, CP2, ... and CPn have a capacity values C0, a capacity value (2×C0), ..., and a capacity value ($2^{(n-1)}$×C0), respectively. That is, the capacity value of the CPi (i=1 to n) is $\{2^{(i-1)} \times C0\}$ and the capacitors CP1, CP2, CP3, ..., and CPn are set so that the capacity ratios are $2^0, 2^1, 2^3, \ldots$, and $2^{(n-1)}$, respectively.

In the configuration as described above, since the transistor switch Qi that receives the delay digital signal SRi providing "1" at its gate is turned ON, the delay time DT increases in correspondence with that the capacitor CPi is electrically connected to the output portion of the inverter Gi. That is, as shown in FIG. 2, in the VDL 1R3, the delay time DT changes in proportion to the binary signal value of n bits composed of the delay digital signals SR1 to SRn (carried in the order of the delay control signals SR1 to SRn, and the SRn is the uppermost (n−1) bits, the SR1 is the lowermost 0 bit).

Other configurations are as same as those of the first preferred embodiment except that counting up of the control logic circuit 2 is an increment of a signal value of n bits composed of the delay digital signals SR1 to SRn, and counting down is a decrement of the signal value of n bits.

As described above, by having the VDL 1R3 capable of setting the delay time DT corresponding to the variable count number of $2^n$ by the delay digital signals SR1 to SRn of n bits, the PLL circuit of the third preferred embodiment makes it possible to calibrate the phase error of the PLL part 10 with high accuracy without enlarging the circuit scale.

<Fourth Preferred Embodiment>

Figure 8:
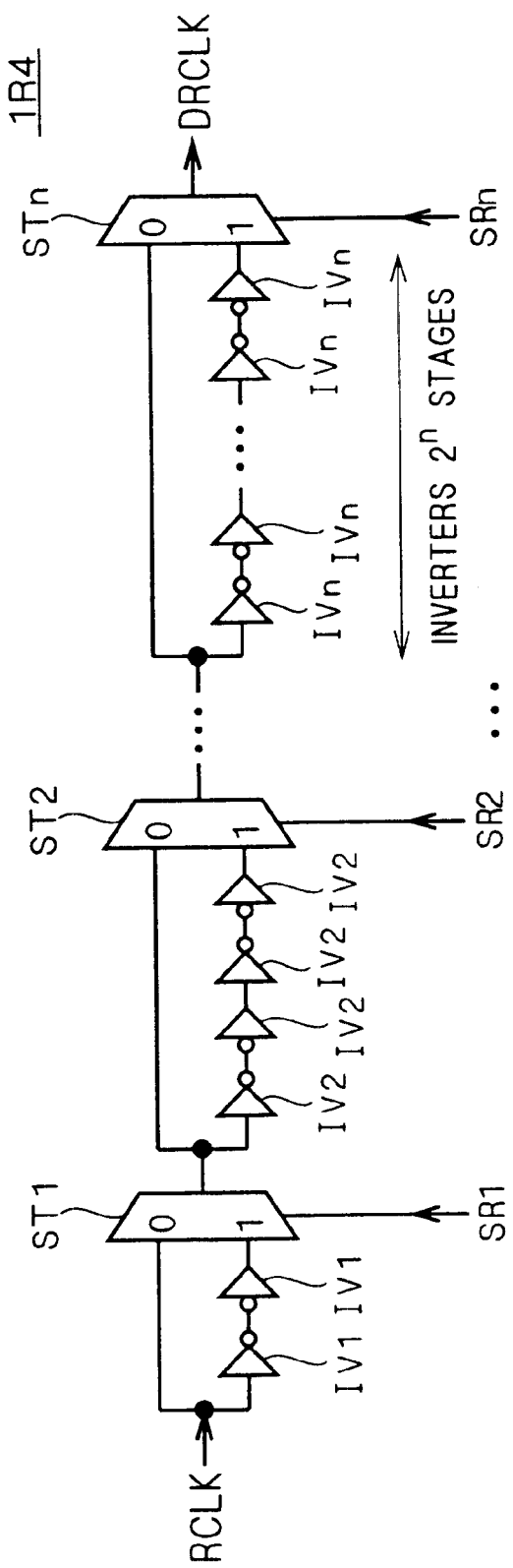
FIG. 8 is a circuit diagram showing a configuration of a VDL in a PLL circuit which is the fourth preferred embodiment of the present invention.

FIG. 8 is a circuit diagram showing a configuration of a VDL 1R in a PLL circuit which is the fourth preferred embodiment of the present invention.

As shown in FIG. 8, a VDL 1R4 is provided with n-stage selectors ST1 to STn connected in serial. The respective "0" input portions of the selectors ST1 to STn are serially connected only via a signal line and the respective "1" input portions thereof are serially connected via invertors IV of more than two stages which are serially connected.

That is, the selector ST1 directly inputs a return clock RCLK at its "0" input portion, and inputs a return clock RCLK via a two-stage inverter IV1 at its "1" input portion. To the selector ST2, output of the selector ST1 is connected at its "0" input portion, and output of the selector ST1 is connected at its "1" input portion via a four-stage inverter IV2. Subsequently, to the selector STk (k=3 to n), output of the selector ST(k−1) is connected at its "0" input portion, and output of the selector ST(k−1) is connected at its "1" input portion via a $2^k$-stage inverter IV. Thus, the selectors ST1 to STn receive the delay digital signals SR1 to SRn, respectively, as control input.

Since a unit signal transmission delay time of the inverters IV1 to Ivn is set uniform, ratios of delay time by the invertors IV1 to Ivn connected to the "1" input portions of the selectors ST1, ST2, ST3, ..., and STn are set to be $2^0$, $2^1, 2^2, \ldots$, and $2^{(n-1)}$.

The VDL 1R4 of the fourth preferred embodiment having such a configuration has a delay path changing function wherein a delay line is formed by the selectors ST1 to STn and the invertor IV and the signal transmission path changes by the delay digital signals SR1 to SRn.

Therefore, since the selector STi that receives the delay digital signal SRi (i=1to n) providing "1" as control input selects the "1" input portion, the delay time DT increases in correspondence with signal transmission via the $2^i$-stage inverter Ivi. That is, as shown in FIG. 2, in the VDL 1R4, the delay time DT changes in proportion to the signal value of n bits composed of the delay digital signals SR1 to SRn (SRn is the uppermost (n−1) bits, SR1 is the lowermost 0 bit).

Other configurations are as same as those of the first preferred embodiment except that counting up of the control logic circuit 2 is an increment of a signal value of n bits composed of the delay digital signals SR1 to SRn, and counting down is a decrement of the above signal value of n bits.

As described above, by having the VDL 1R4 capable of setting the delay time DT corresponding to the variable count number of $2^n$ by the delay digital signals SR1 to SRn of n bits, the PLL circuit of the fourth preferred embodiment makes it possible to calibrate the phase error between the input clock ICLK and the return clock RCLK of the PLL part 10 with high accuracy without enlarging the circuit scale.

In addition, as is the same with the second preferred embodiment, there is an advantage that the circuit scale can be miniaturized as a consequence of being to configure only by transistor.

<Fifth Preferred Embodiment>

Figure 9:
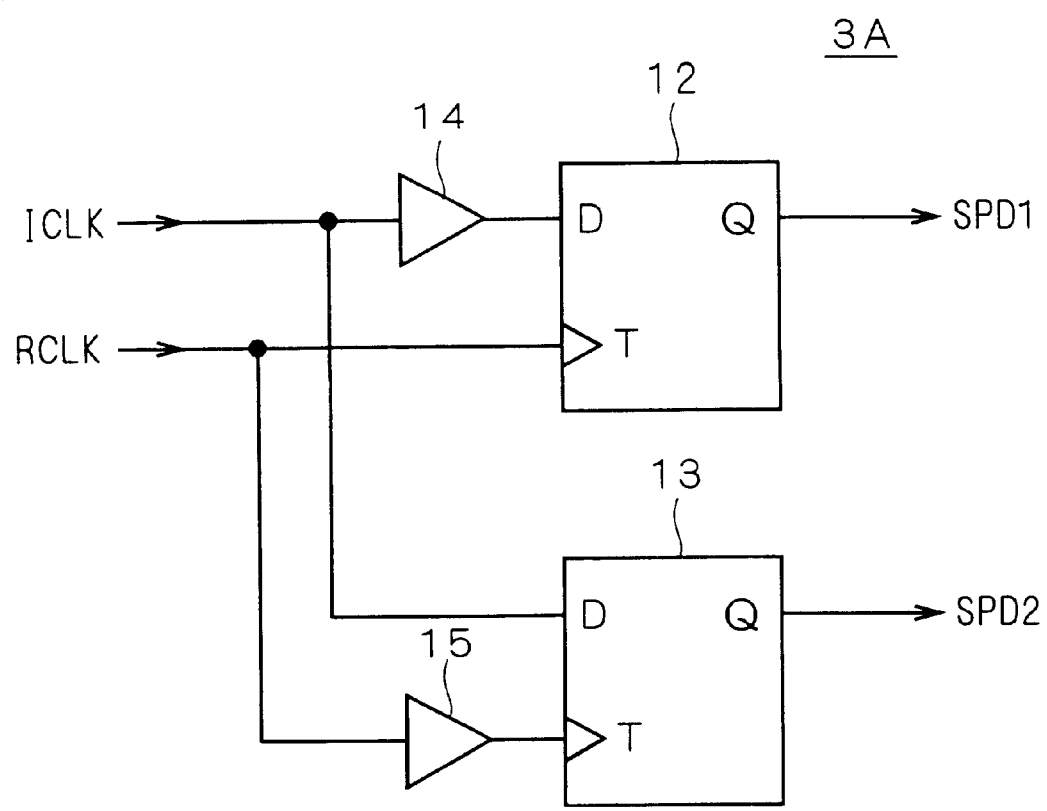
FIG. 9 is a circuit diagram showing a configuration of a PD in a PLL circuit which is the fifth preferred embodiment of the present invention.

FIG. 9 is a circuit diagram showing a configuration of a PD 3 in a PLL circuit which is the fifth preferred embodiment of the present invention.

As shown in FIG. 9, the PD 3A of the fifth preferred embodiment is configured by two D-FFs 12 and 13, and two delay circuits 14 and 15. The D-FF 12 receives an input clock ICLK as input data D via the delay circuit 14, directly receives a return clock RCLK at toggle input T, and outputs a phase comparison signal SPD1 from Q output.

On the other hand, the D-FF 13 directly receives an input clock ICLK as input data D, receives a return clock RCLK at the toggle input T via the delay circuit 15, and outputs a phase comparison signal SPD2 from Q output.

The delay times by the delay circuits 14 and 15 are set so as to satisfy the acceptable range of a predetermined phase error.

Other configurations are as same as those of the first preferred embodiment. It is to be noted that the control logic circuit 2 receives the phase comparison signals SPD1 and SPD2 in place of the phase comparison signal SPD, and when both of the phase comparison signals SPD1 and SPD2 are "H", it is determined that the phase comparison signal SPD is "H" in step S2 of FIG. 2, and when both of the phase comparison signals SPD1 and SPD2 are "L", it is determined that the phase comparison signal SPD is "L" in step S2 of FIG. 5.

That is, when the phase comparison signal SPD1 differs in value from the phase comparison signal SPD2, it is regarded that the phase error falls within the acceptable range, so that it is regarded that there is no phase difference between the input clock ICLK and the return clock RCLK.

Therefore, it is possible to securely avoid occurrence of an erroneous signal output of "H" or "L" (meta-stable) when the phase error between the input clock ICLK and the return clock RCLK falls within the predetermined acceptable range as is the case of the PD 3 shown in FIG. 4.

In this manner, the PLL circuit of the fifth preferred embodiment can performs a phase error calibrating process of the PLL part 10 without causing malfunction by avoiding an erroneous signal output of the PD.

<Sixth Preferred Embodiment>

Figure 10:
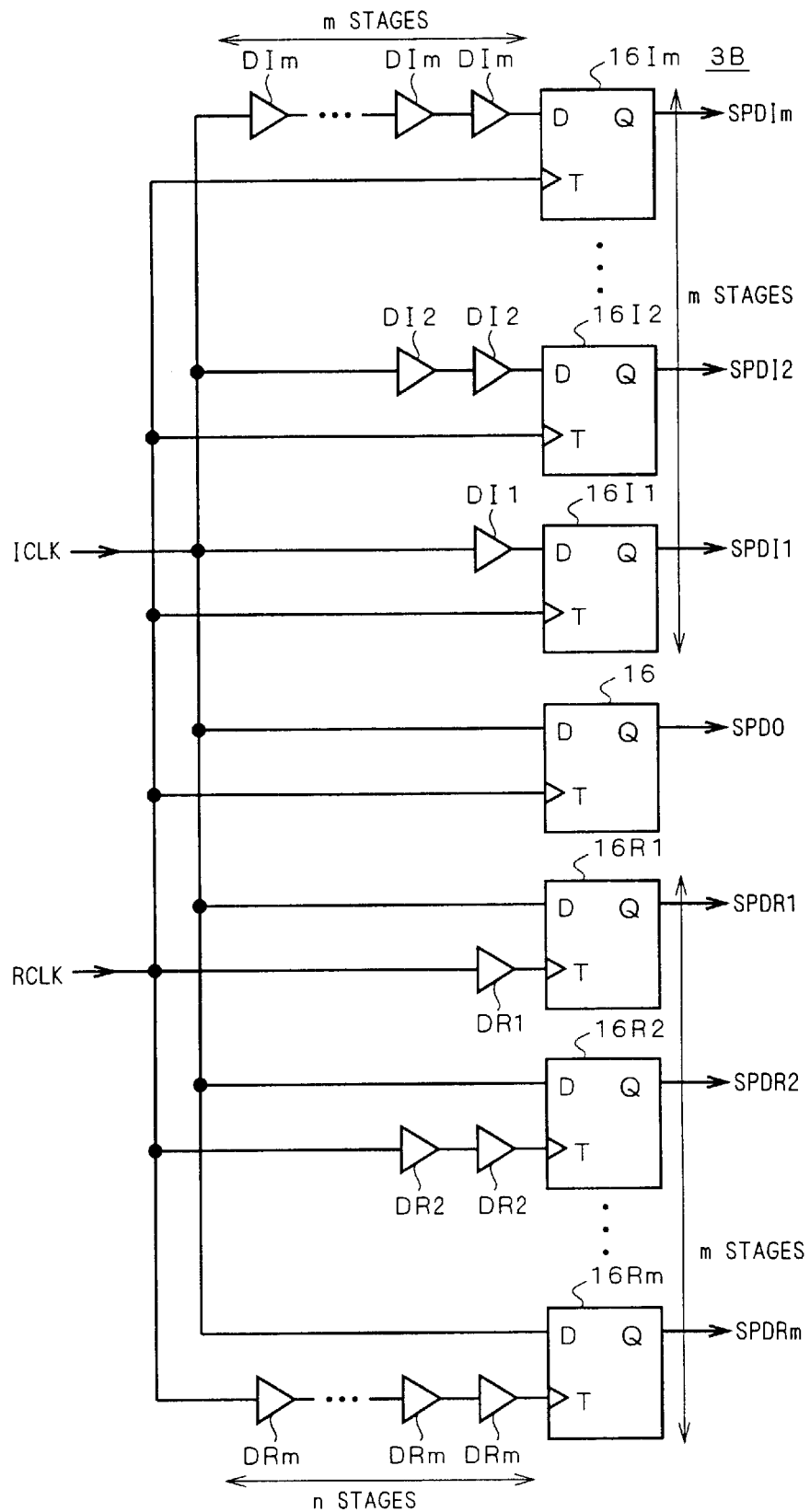
FIG. 10 is a circuit diagram showing a configuration of a PD in a PLL circuit which is the sixth preferred embodiment of the present invention.

FIG. 10 is a circuit diagram showing a configuration of a PD 3 in a PLL circuit which is the sixth preferred embodiment of the present invention.

As shown in FIG. 10, the PD 3B of the sixth preferred embodiment is configured by (2m+1) D-FFs D-FFs 16I1 to 16Im, 16, and D-FFs 16R1 to 16Rm, and 2m kinds of delay circuits DI1 to DIm and DR1 to DRm.

The D-FF 16 directly receives an input clock ICLK as input data D, directly receives a return clock RCLK at toggle input T and outputs a phase comparison signal SPD0 at Q output.

The D-FF 16Ii (i=1 to m) receives an input clock ICLK via an i-stage inverter DIi, directly receives a return clock RCLK at toggle input T to output it from Q output as a phase comparison signal SPDIi.

The D-FF 16Ri (i=1 to m) receives a return clock RCLK at toggle input T via an i-stage inverter DRi, and directly receives an input clock ICLK as input data D to output it from Q output as a phase comparison signal SPDRi.

The delay time for one delay circuit DIi and the delay time for one delay circuit DRi are each set at the same basic delay time DS. Other configurations are as same as those of the first preferred embodiment except for the operation of the control logic circuit 2.

Figure 11:
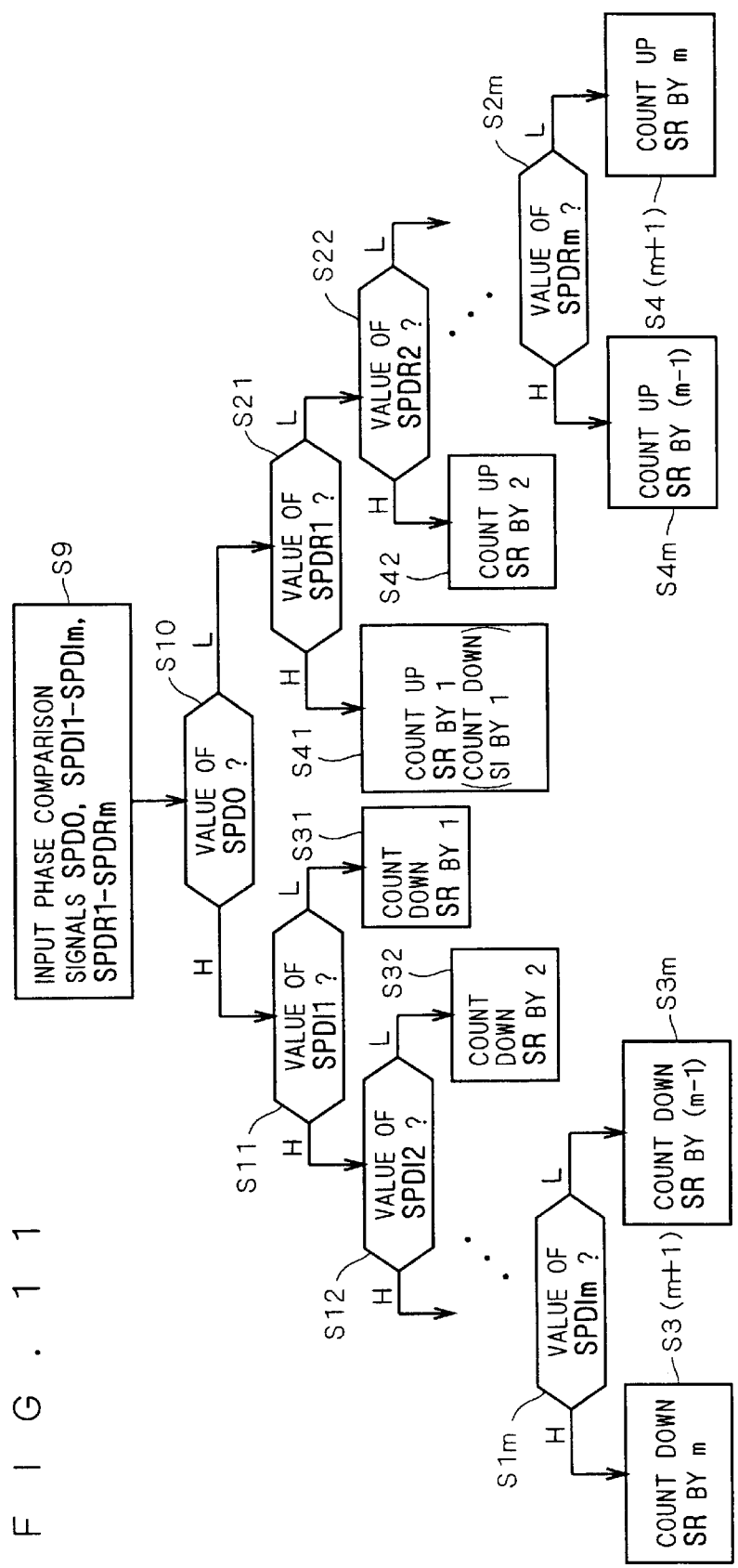
FIG. 11 is a flowchart showing an operation of a control logic circuit of the sixth preferred embodiment.

FIG. 11 is a flow chart showing an operation of the control logic circuit 2 of the sixth preferred embodiment. In the following, a counting operation of delay control signal SR by the control logic signal 2 will be explained while referring to FIG. 11.

First, in step S9, the phase comparison signals SPD0, SPDI1 to SPDIm and SPDR1 to SPDRm are inputted from the PD 3B.

Next, in step S10, the value of the phase comparison signal SPD0 is recognized, and when the value is determined to be "H", the flow proceeds to S11, whereas when the value is determined to be "L", the flow proceeds to step S21.

In step S11, the value of the phase comparison signal SPDI1 is recognized, and when the value is determined to be "H", the flow proceeds to step S12, whereas when the value is determined to be "L", it is determined that the phase of the return clock RCLK delays from the input clock ICLK by not less than "0" and by not more than one basic delay time DS, and the delay control signal SR is counted down by 1.

Also in steps subsequent to step S12, in the same manner as described above, the value of the phase comparison signal SPDIj is recognized in step S1j (j=2 to (m−1)), and when the value is determined to be "H", the flow proceeds to step S1(j+1), whereas when the value is determined to be "L", it is determined in step S3j that the return clock RCLK delays in phase than the input clock ICLK by not less than (j−1)×basic delay time DS and not more than j×basic delay time DS, and the delay control signal SR is counted down by j.

Then, in step S1m, the value of the phase comparison signal SPDIm is recognized, and when the value is determined to be "H", it is determined in step S3(m+1) that the return clock RCLK delays in phase than the input clock ICLK by not less than m×basic delay time DS, and the delay signal SR is counted down by m, whereas when the value is determined to be "L", it is determined in step S3m that the return clock RCLK delays in phase than the input clock ICLK by not less than (m−1)×basic delay time DS and not more than m×basic delay time DS and the delay control signal SR is counted down by (m−1).

On the other hand, in step S21, the value of the phase comparison signal SPDR1 is recognized, and when the value is determined to be "L", the flow proceeds to step S22, whereas the value is determined to be "H", it is determined in step S41 that the return clock RCLK advances in phase than the input clock ICLK by not less than "0" and not more than one basic delay time DS, and the delay control signal SR is counted up by one.

As for steps subsequent to step S22, in the same manner as described above, in step S2j (j=2 to (m−1)), the value of the phase comparison signal SPDRj is recognized, and when the value is determined to be "L", the flow proceeds to step S2(j+1), whereas when the value is determined to be "H", it is determined in step S4j that the return clock RCLK advances in phase than the input clock ICLK by not less than (j−1)×basic delay time DS and not more than j×basic delay time DS, and the delay control signal SR is counted up by j.

Then, in step S2m, the value of the phase comparison signal SPDRm is recognized, and when the value is determined to be "L", it is determined in step S4(m+1) that the return clock RCLK advances in phase than the input clock ICLK by not less than m×basic delay time DS, and the delay control signal SR is counted up by m, whereas when the value is determined to be "H", it is determined in step S4m that the return clock RCLK advances in phase than the input clock ICLK by not less than (m−1)×basic delay time DS and not more than m×basic delay time DS, and the delay control signal SR is counted up by (m−1).

In such a way as described above, the PLL circuit of the sixth preferred embodiment determines the phase difference between the input clock ICLK and the return clock RCLK by a time range, and the control logic circuit 2 determines the count-up width or count-down width of the delay control signal SR based on the time width of the phase difference, with the result that it is possible to calibrate the phase error between the input clock ICLK and the return clock RCLK occurring in the PLL part 10 with high speed.

<Seventh Preferred Embodiment>

Figure 12:
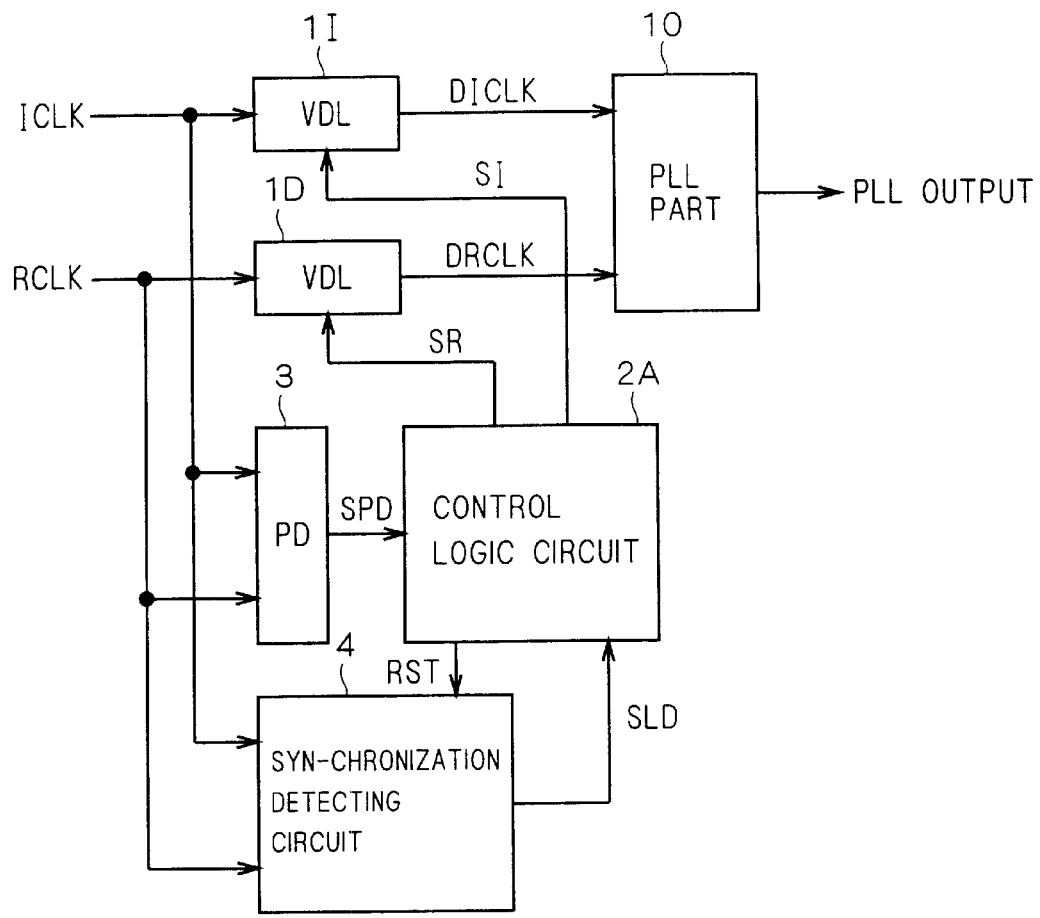
FIG. 12 is a block diagram showing an internal configuration of a PLL circuit which is the seventh preferred embodiment of the present invention.

FIG. 12 is a block diagram showing an internal configuration of a PLL circuit which is the seventh preferred embodiment of the present invention. As shown in FIG. 12, it differs from the PLL circuit of the first preferred embodiment in that a synchronization detecting circuit 4 is added.

The synchronization detecting circuit 4 receives an input clock ICLK and a return clock RCLK, and when detecting synchronization of the input clock ICLK and the return clock RCLK, it outputs a synchronization detecting signal SLD of active state to the control logic circuit 2.

A control logic circuit 2A differs from the control logic circuit 2 of the first preferred embodiment shown in FIG. 1 in that it gives a reset signal SRT of active state to the synchronization detecting circuit 4 every predetermined time interval, and that it performs signal control of the delay control signals SR and SI at the time when receiving the synchronization detecting signal SLD of active state.

Figure 13:
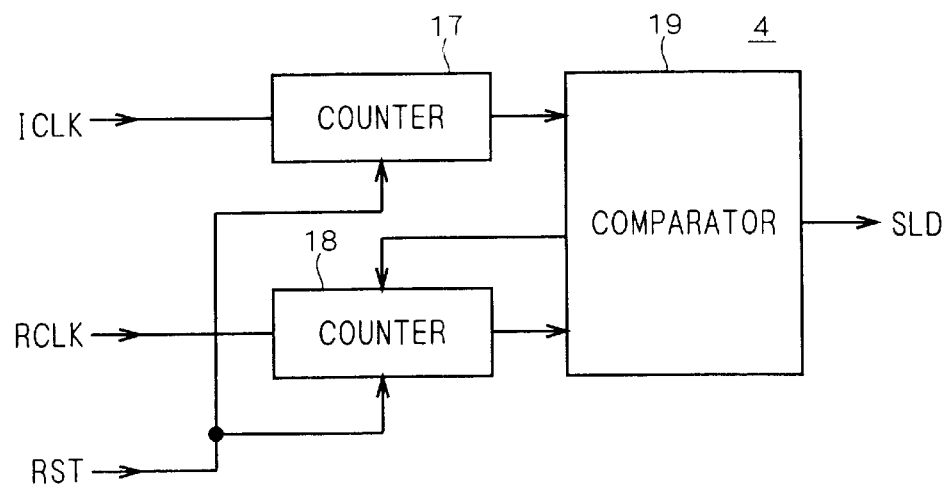
FIG. 13 is a block diagram showing an example of internal configuration of a synchronization detecting circuit of FIG. 12.

FIG. 13 is a block diagram showing an example of an internal configuration of the synchronization detecting circuit 4. As shown in FIG. 13, the synchronization detecting circuit 4 is configured by counters 17 and 18, and a comparator 19. The counter counts the number of pulses of the input clock ICLK, and the counter 18 counts the number of pulses of the return clock RCLK. The respective count values of the counters 17 and 18 are initialized to "0" in response to reception of the reset signal RST of active state.

The comparator 19 receives counter values of the counters 17 and 18, and when the respective counter values coincide with each other at not less than a predetermined value CM, it outputs the synchronization detecting signal SLD of active state. For example, assuming that the number of pulses of the return clock RCLK is represented by CR ($\geq$CM) counts of the counter 18 when the number of pulses of the input clock ICLK is represented by CI ($\geq$CM) counts of the counter 17, the comparator 19 make a determination of synchronization when CI=CR.

As described above, in the PLL circuit of the seventh preferred embodiment, by providing the synchronization detecting circuit 4, the control logic circuit 2 can operate after synchronization is detected by the synchronization detecting circuit 4, and even if the numeric of n of step S3 in the flow of the control logical circuit 2 shown in FIG. 5 is decreased, a malfunction will not occur. Therefore, by decreasing the numeric of n, it is possible to calibrate the phase error between the input clock ICLK and the return clock RCLK occurring in the PLL part 10 with high speed.

<Other Points>

In the preferred embodiments as described above, a control such that the delay time of the VDL 1I is fixed and the delay time DT of the VDL 1R (1R1 to 1R4) is changed has been shown, however, contrarily to the above, a control wherein delay time of the VDL 1R is fixed and the delay time of the VDL 1I is changed is also applicable. For example, for controlling the delay time VDL 1I in the step of Step S41 of FIG. 11, as shown inside the parentheses, the control signal SI can be counted up by 1. Furthermore, it is also possible to variably control the delay times of both the VDL 1I and the VDL 1R so as to reduce the phase difference between the input clock ICLK and the return clock RCLK.

While the invention has been shown and described in detail, the foregoing description is in all aspects illustrative and not restrictive. It is therefore understood that numerous other modifications and variations can be devised without departing from the scope of the invention.

What is claimed is:

1. A PLL circuit comprising:

first delay means for delaying a reference clock by a first delay time to obtain a delayed reference clock;

second delay means for delaying a return clock by a second delay time to obtain a delayed return clock;

a PLL part for receiving said delayed reference clock and said delayed return clock and outputting a PLL output so that phases of the delayed reference and delayed return clocks are synchronous with each other, a signal in association with said PLL output being returned as said return clock; and phase difference reducing delay control means for performing a delay means controlling process based on said reference clock and said return clock, said delay means control process changing at least one of said first and second delay time so that a phase difference between said reference clock and said return clock is reduced, wherein said phase difference reducing delay controlling means includes:

phase comparing means for comparing phases of said reference clock and said return clock to output a phase comparison signal; and delay controlling means for performing said delay means controlling process wherein a degree of advance in phase of said return clock with respect to said reference clock is determined based on said phase comparison signal, and a first and a second delay control signals are outputted to said first and second delay means, the first and the second delay control signals being such that the instruction contents thereof change in such a direction that a relative delay time of said second delay time to said first delay time increases when a phase advance determination representing that said return clock advances in phase is made, and in such a direction that said relative delay time decreases when a phase delay determination representing that said return clock delays in phase is made, and wherein said second delay means includes:

a delay line for inputting said return clock at an input end, allowing the return clock to transmit therethrough and outputting the return clock as said delayed return clock from an output end; and capacity value changing means connected to said delay line, a capacity value thereof associated with said delay line being changed based on said second delay control signal.

2. The PLL circuit according to claim 1, wherein said phase difference reducing delay control means starts said delay means controlling process after a predetermined time which is not less than a time within which said PLL part is assumed to complete synchronization process of said delayed reference clock and said delayed return clock has elapsed.

3. The PLL circuit according to claim 1, further comprising:

a synchronization detecting circuit for receiving said delayed reference clock and said delayed return clock, detecting whether or not these signals have come into synchronization with each other to output a synchronization detection signal, wherein said phase difference reducing delay control means starts said delay means controlling process after said synchronization detection signal has indicated synchronization of said delayed reference clock and said delayed return clock.

4. The PLL circuit according to claim 1, wherein said first delay control signal includes a signal for fixing said first delay time at a predetermined time, said second delay control signal includes first to nth ($n \geq 2$) delay digital signals, said delay line includes first to nth inverters serially connected in the order of first to nth, said capacity value changing means includes:
first to nth switching devices ON/OFF controlled by said first to nth delay digital signals; and
first to nth capacitors respectively connected to outputs of said first to nth inverters via said first to nth switching devices, and
said delay control means changes said first to nth delay digital signals in such a direction that makes a total capacity values of capacitors electrically connected to said first to nth inverters among said first to nth capacitors increase when said phase advance determination is made, and changes said first to nth delay digital signals in such a direction that makes said total capacity values increase when said phase delay determination is made.

5. The PLL circuit according to claim 4, wherein said first to nth capacitors are set at the same capacity value, and said delay control means sets said first to nth delay digital signals in a direction that increases the number of signals indicating ON state when said phase advance determination is made, and sets said first to nth delay digital signals in a direction that decreases the number of signals indicating ON state when said phase delay determination is made.

6. The PLL circuit according to claim 4, wherein said first, second, third, . . . , and nth capacitors are set so that capacity ratios of capacity value are $2^0, 2^1, 2^2, \ldots,$ and $2^{(n-1)}$, and assuming that said first to nth delay digital signals represent a binary signal value carried in the order of first to nth, said delay control means controls said first to nth delay digital signals in a direction that increases said binary signal value when said phase advance determination is made, and controls said first to nth delay digital signals in a direction that decreases said binary signal value when said phase delay determination is made.

7. The PLL circuit according to claim 1, wherein said second delay means includes
a delay line for inputting said return clock at an input end, allowing the return clock to transmit therethrough and outputting the return clock as said delayed return clock from an output end; and
said delay line has a delay path changing function of changing a signal transmission path of said delay line based on said second delay control signal.

8. The PLL circuit according to claim 7, wherein said first delay control signal includes a signal for fixing said first delay time at a predetermined time, said second delay control signal includes first to nth ($n \geq 2$) delay digital signals, said delay line includes first to nth selector serially connected in the order of first to nth, said first selector receives said return clock at one input portion and receives said return clock via a first partial delay portion at the other input portion, respective one input portions of said second to nth selectors are connected with output portions of said first to (n−1)th selectors, and respective the other input portions of said second to nth selectors are connected with output portions of said first to (n−1)th selectors via said second to nth partial delay portions, said delayed return clock is generated from an output of said nth selector, said first to nth selectors respectively receive said first to nth delay digital signals at their control input portion, and either one of one input portion and the other input portion is selected by said first to nth delay digital signals, and said delay control means changes said first to nth delay digital signals in a direction that increases a total delay time by partial delay portion that is selected as the other input portion of said first to nth selectors among said first to nth partial delay portions when said phase advance determination is made, and changes said first to nth delay digital signals in a direction that decreases said total delay time when said phase delay determination is made.

9. The PLL circuit according to claim 8, wherein said first to nth partial delay portions are set to be the same delay time, and said delay control means controls said first to nth delay digital signals in a direction that increases the number of signals indicating selection of the other input portion when said phase advance determination is made, and controls said first to nth delay digital signals in a direction that decreases the number of signals indicating selection of the other input portion when said phase delay determination is made.

10. The PLL circuit according to claim 9, wherein said first, second, third, . . . , and nth partial delay portions are set so that ratios of delay time are $2^0, 2^1, 2^2, \ldots,$ and $2^{(n-1)}$; and assuming that said first to nth delay digital signals represent a binary signal value carried in the order of first to nth, said delay control means controls said first to nth delay digital signals in a direction that increases said binary signal value when said phase advance determination is made, and controls said first to nth delay digital signals in a direction that decreases said binary signal value when said phase delay determination is made.

11. The PLL circuit according to claim 1, wherein said phase comparing means includes a D-type flip-flop which receives said reference clock at one of a data input and a toggle input, receives said return clock at the other of said data input and said toggle input, and outputs said phase comparison signal from an output portion.

12. The PLL circuit according to claim 11, wherein said phase comparison signal includes a first-class and a second-class phase comparison signals, assuming that the first-class is defined for delaying input clock and the second-class is defined for delaying return clock;

said phase comparing means further includes:
a first-class delay portion, and
a second-class delay portion, and
said D-type flip-flop includes:
- a first-class D-type flip-flop which receives said reference clock at a first input via said first-class delay portion, directly receives said return clock at a second input, and outputs said first-class phase comparison signal from the output portion; and
- a second-class D-type flip-flop which directly receives said reference clock at a third input via said second-class delay portion, directly receives said return clock at a fourth input, and outputs said second-class phase comparison signal from the output portion.

13. The PLL circuit according to claim 12, wherein
said first-class delay portion includes first to mth first-class delay portions of which delay times are set to be longer in the order of said first to mth (m≧2),
said second-class delay portion includes first to mth second-class delay portions of which delay times are set to be longer in the order of said first to mth,
said phase comparison signal includes a standard phase comparison signal,
said first-class phase comparison signal includes first to mth first phase comparison signals;
said second-class phase comparison signal includes first to mth second phase comparison signals;
said first-class D-type flip-flop includes first to mth first-class D-type flip-flops which receive said reference clock at the first input via said first to mth first-class delay portions, directly receive said return clock at the second input and output said first to mth first-class phase comparison signals from respective outputs;
said second-class D-type flip-flop includes first to mth second-class D-type flip-flops which directly receive said reference clock at the third input, receive said return clock at the fourth input via said first to mth second-class delay portions, and output said first to mth second-class phase comparison signals;
said D-type flip-flop further includes:
a standard D-type flip-flop which directly receives said reference clock at one of inputs, directly receives said return clock at the other of the inputs, and outputs said standard phase comparison signal from an output portion, and
said delay control means determines a phase difference between said reference clock and said return clock on the basis of said first to mth first-class phase comparison signals, said standard phase comparison signal and said first to mth second-class phase comparison signals, and output said first and second delay signals indicating that said relative delay time changes in a time width in consideration of said phase difference.

* * * * *

UNITED STATES PATENT AND TRADEMARK OFFICE
CERTIFICATE OF CORRECTION

PATENT NO. : 6,646,484 B2
DATED : November 11, 2003
INVENTOR(S) : Yoshiaki Ito

It is certified that error appears in the above-identified patent and that said Letters Patent is hereby corrected as shown below:

Column 13,
Lines 57-61, delete
"said second delay means includes
 a delay line for input said return clock at an input
   end, allowing the return clock to transmit there-
   through and outputting the return clock as said
   delayed return clock from and output end; and"

Column 14,
Line 42, change "9" to -- 8 --.

Signed and Sealed this

Twentieth Day of April, 2004

JON W. DUDAS
*Acting Director of the United States Patent and Trademark Office*